(12) United States Patent
Otsuki et al.

(10) Patent No.: US 9,130,176 B2
(45) Date of Patent: *Sep. 8, 2015

(54) MATERIAL FOR HOLE INJECTION TRANSPORT LAYERS, INK FOR FORMING HOLE INJECTION TRANSPORT LAYERS, DEVICE, AND PRODUCTION METHODS THEREOF

(71) Applicant: DAI NIPPON PRINTING CO., LTD., Tokyo-to (JP)

(72) Inventors: Eiji Otsuki, Tokyo-to (JP); Masaya Shimogawara, Tokyo-to (JP); Masato Okada, Tokyo-to (JP); Toshihiko Takeda, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/348,778

(22) PCT Filed: Sep. 25, 2012

(86) PCT No.: PCT/JP2012/074546
§ 371 (c)(1),
(2) Date: Mar. 31, 2014

(87) PCT Pub. No.: WO2013/061720
PCT Pub. Date: May 2, 2013

(65) Prior Publication Data
US 2014/0231795 A1 Aug. 21, 2014

(30) Foreign Application Priority Data
Oct. 25, 2011 (JP) .................. 2011-233904

(51) Int. Cl.
*H01L 51/00* (2006.01)
*C09D 11/037* (2014.01)
(Continued)

(52) U.S. Cl.
CPC .......... *H01L 51/0084* (2013.01); *C09D 11/037* (2013.01); *H01L 51/0005* (2013.01);
(Continued)

(58) Field of Classification Search
CPC ............ H01L 51/0039; H01L 51/0043; H01L 51/5088; H01L 51/5056; H01L 51/0081; H01L 51/0085; H01L 51/105; H01L 51/0084; H01L 51/5012; H01L 51/0005; H01L 51/0545; C09D 11/037
See application file for complete search history.

(56) References Cited

U.S. PATENT DOCUMENTS

2004/0127690 A1* 7/2004 Chaudhari et al. .............. 534/11
2005/0084605 A1* 4/2005 Kathirgamanathan .......... 427/64
(Continued)

FOREIGN PATENT DOCUMENTS

JP 2824411 B2 9/1998
JP 2000-036390 A 2/2000
(Continued)

OTHER PUBLICATIONS

Gerald Doyle, "The Reaction of Some Molybdenum and Tungsten Halides With β-Diketones", Inorganic Chemistry vol. 10, No. 10, 1971 pp. 2348-2350, XP055153219, DOI: 10.102/ic50104a059.
(Continued)

*Primary Examiner* — Gregory Clark
(74) *Attorney, Agent, or Firm* — Ladas & Parry LLP

(57) ABSTRACT

The present invention is to provide the following: a material for hole injection transport layers and a production method thereof, the material capable of forming a hole injection transport layer by the solution application method and increasing device lifetime; an ink for forming hole injection transport layers and a production method thereof, the ink capable of forming a hole injection transport layer by the solution application method and increasing device lifetime; and a long-life device and a production method thereof; wherein disclosed is a material for hole injection transport layers, which is a reaction product of a molybdenum complex with a compound represented by the following chemical formula (i):

Chemical Formula (I)

$$R^1\diagdown X^1\diagup\underset{\underset{H_2}{C}}{\overset{\overset{O}{\|}}{C}}\diagdown\overset{O}{\underset{\|}{C}}\diagup X^2\diagdown R^2$$

wherein R1, R2, X1 and X2 are as explained in the Description.

15 Claims, 2 Drawing Sheets

(51) Int. Cl.
- *H01L 51/50* (2006.01)
- *H01L 51/05* (2006.01)
- *H01L 51/10* (2006.01)

(52) U.S. Cl.
CPC ......... *H01L51/5012* (2013.01); *H01L 51/0039* (2013.01); *H01L 51/0043* (2013.01); *H01L 51/0081* (2013.01); *H01L 51/0085* (2013.01); *H01L 51/0545* (2013.01); *H01L 51/105* (2013.01); *H01L 51/5056* (2013.01); *H01L 51/5088* (2013.01); *H01L 2251/308* (2013.01)

(56) References Cited

U.S. PATENT DOCUMENTS

| | | |
|---|---|---|
| 2007/0200125 A1 | 8/2007 | Ikeda et al. |
| 2007/0241665 A1 | 10/2007 | Sakanoue et al. |
| 2007/0290604 A1 | 12/2007 | Sakanoue et al. |
| 2011/0037065 A1* | 2/2011 | Ueno et al. ............ 257/40 |
| 2012/0119194 A1 | 5/2012 | Nagai et al. |

FOREIGN PATENT DOCUMENTS

| | | |
|---|---|---|
| JP | 2002-204012 A | 7/2002 |
| JP | 3748110 B1 | 12/2005 |
| JP | 3748491 B2 | 2/2006 |
| JP | 2006-155978 A | 6/2006 |
| JP | 2007-287586 A | 11/2007 |
| JP | 2008-041894 A | 2/2008 |
| JP | 2009-290205 A | 12/2009 |
| JP | 2011-134895 A | 7/2011 |
| JP | 2011-171243 A | 9/2011 |
| JP | 2011-176324 A | 9/2011 |
| WO | 2011/010696 A1 | 1/2011 |

OTHER PUBLICATIONS

Extended European Search Report Appln. No. 12 843 108,7; Dated Nov. 24, 2014.
Tsunenori Suzuki, et al; 69.3: Polymer/Metal-Oxide Composite: A Novel Buffer Layer for Solution-Processible OLEDS; pp. 1840-1842; May 2007.
International Search Report mailed Jan. 15, 2013; PCT/JP2012/074546.

* cited by examiner

MATERIAL FOR HOLE INJECTION TRANSPORT LAYERS, INK FOR FORMING HOLE INJECTION TRANSPORT LAYERS, DEVICE, AND PRODUCTION METHODS THEREOF

TECHNICAL FIELD

The present invention relates to a material for hole injection transport layers, an ink for forming hole injection transport layers, a device, and production methods thereof.

BACKGROUND ART

A device comprising an organic material is expected to be applied to wide range of elementary devices and applications such as an organic electroluminescence device (hereinafter referred to as organic EL device), an organic transistor, an organic solar cell, an organic semiconductor, etc. Other devices comprising a hole injection transport layers include a quantum-dot light emitting device, an oxide compound solar cell, etc.

The organic EL device is a charge injection type light emitting device, which uses emission of light generated by the recombination of holes and electrons that have reached a light emitting layer. This type of organic EL devices have been actively developed since, in 1987, T. W. Tang et al. demonstrated that a device obtained by stacking thin films each made of a fluorescent metal chelate complex and diamine molecules can emit high-intensity light at a low driving voltage.

The device structure of the organic EL device comprises a cathode/an organic layer/an anode. In early organic EL devices, this organic layer had a two-layered structure comprising a light emitting layer/a hole injection layer. In recent years, however, to obtain high light emission efficiency and long driving life, various kinds of multi-layered structures have been proposed, such as a five-layered structure comprising an electron injection layer/an electron transport layer/a light emitting layer/a hole transport layer/a hole injection layer.

The layers other than the light emitting layer, such as the electron injection layer, the electron transport layer, the hole transport layer and the hole injection layer, are said to be effective in allowing smooth injection and/or transport of charge into the light emitting layer, maintaining the balance between the electronic current and hole current by blocking charge, or preventing diffusion of light energy excitons, for example.

In order to improve charge transport ability and charge injection ability, it has been attempted to increase electrical conductivity, by mixing an oxidizing compound with a hole transporting material (Patent Literatures 1 and 2).

In Patent Literature 1, the following compound are used as the oxidizing compound, that is, as the electron accepting compound: a compound comprising a triphenylamine derivative and a counter anion such as antimony hexafluoride, and a compound with extremely high electron-accepting properties, in which cyano groups are bound to carbons of a carbon-carbon double bond, such as 7,7,8,8-tetracyanoquinodimethane.

In Patent Literature 2, general oxidizers are exemplified as the oxidizing dopant; moreover, metal halides, Lewis acids and organic acids, and salts of arylamines and metal halides or Lewis acids, are mentioned.

In Patent Literatures 3 to 6, metal oxides, being compound semiconductors, are used as the oxidizing compound, that is, as the electron-accepting compound. In order to obtain a hole injection layer with excellent injection properties and excellent charge transfer properties, for example, a thin film is formed by evaporation using a metal oxide such as vanadium pentoxide or molybdenum trioxide, or a mixed film is formed by co-evaporation of a molybdenum oxide and a low-molecular amine compound.

In Patent Literature 7, a production method is mentioned as an attempt to form a coating film of vanadium pentoxide, which is such a method that a solution in which oxovanadium (V)tri-i-propoxide oxide is dissolved, is used as the oxidizing compound, that is, as the electron-accepting compound, and a mixed coating film of the solution and a hole transporting polymer is formed and then hydrolyzed in water vapor to form a charge transfer complex.

In Patent Literature 8, as an attempt to form a coating film of molybdenum trioxide, it is mentioned that molybdenum trioxide is physically ground to produce fine particles and then dispersed in a solution to produce a slurry, and the slurry is applied to form a hole injection layer and thus to produce a long-life organic EL device.

The organic transistor is a thin-film transistor in which an organic semiconductor material comprising a π-conjugated, organic high-molecular compound or a π-conjugated, organic low-molecular compound is used in the channel region. A common organic transistor has a structure comprising a substrate, a gate electrode, a gate insulating layer, a source electrode, a drain electrode and an organic semiconductor layer. In the organic transistor, the gate voltage applied to the gate electrode is changed to control the charge amount of an interface between the gate insulating layer and the organic semiconductor layer, thus changing the current value between the source electrode and the drain electrode for switching.

As an attempt to increase the on-current value of the organic transistor and stabilize the device properties by reducing the charge injection barrier between the organic semiconductor layer and the source or drain electrode, is it known to increase the carrier density in the organic semiconductor layer adjacent to the electrode, by introducing a charge transfer complex into the organic semiconductor layer (for example, Patent Literature 9).

However, even though the oxidizing materials as disclosed in Patent Literatures 1 to 9 are used as the hole transporting material, it is still difficult to realize a long-life device or there is a need for a further increase in device lifetime.

In Patent Literature 10, as a technique for increasing device lifetime by forming a hole injection transport layer by a solution applying method, a device comprising a hole injection transport layer that contains a reaction product of a molybdenum or tungsten complex, is disclosed. However, there is still a demand for a further increase in device lifetime.

CITATION LIST

Patent Literature 1: Japanese Patent Application Laid-Open (JP-A) No. 2000-36390
Patent Literature 2: JP Patent No. 3748491
Patent Literature 3: JP-A No. 2006-155978
Patent Literature 4: JP-A No. 2007-287586
Patent Literature 5: JP Patent No. 3748110
Patent Literature 6: JP Patent No. 2824411
Patent Literature 7: SID 07 DIGEST p. 1840-1843 (2007)
Patent Literature 8: JP-A No. 2008-041894
Patent Literature 9: JP-A No. 2002-204012
Patent Literature 10: JP-A No. 2009-290205

SUMMARY OF INVENTION

Technical Problem

It is difficult to produce a long-life device with the oxidizing materials as disclosed in Patent Literatures 1, 2 and 9. This is presumed to be because the oxidizing material has low capability of oxidizing the hole transporting material or has poor dispersion stability in thin films, such as aggregation of part of the oxidizing material or deposition of the oxidizing material on an interface with an adjacent layer. Such a change in dispersion stability upon driving also changes the carrier injection or transport in the device, and thus it is thought that there are adverse effects on device lifetime properties. The metal oxides as disclosed in Patent Literature 3 to 5 can improve hole injection properties. However, the adhesion of the interface with the adjacent organic compound layer becomes insufficient, and thus it is thought that there are adverse effects on device lifetime properties.

The oxidizing materials as disclosed in Patent Literatures 1 to 9 are insufficient in such a solvent solubility that the materials are dissolved simultaneously with a hole transporting high-molecular compound which will be formed into a film by the solution application method. Therefore, the oxidizing materials have the following problems, for example: the oxidizing material is likely to aggregate only by itself, or applicable solvent species are limited and results in a lack of versatility. Especially, the molybdenum oxides of inorganic compounds have relatively high properties; however, they are insoluble in solvents and have a problem such that the solution application method is not applicable to them. Even though the slurry as disclosed in Patent Literature 8 is used, which is obtained by dispersing molybdenum oxides particles in a solvent, the particles in the solution state are instable and only a film with large convexoconcaves and poor smoothness can be formed from the slurry, which is responsible for short circuit in devices. In addition, the molybdenum oxides of inorganic compounds are oxygen-deficient oxide semiconductors. For electrical conductivity, compared to $MoO_3$ having an oxidation number of +6, $Mo_2O_5$ having an oxidation number of +5 is a good conductor at normal temperature; however, it is unstable in the air. Therefore, compounds which can be easily thermally deposited thereon are limited to oxidized compounds having a stable valence, such as $MoO_2$ and $MoO_2$.

Disclosed in Patent Literature 7 is a method for producing a charge transfer complex as a vanadium oxide, in which a mixed coating film of a hole transporting polymer and oxovanadium(V)tri-i-propoxide oxide is formed and then hydrolyzed in water vapor, thus producing the charge transfer complex as a vanadium oxide. In Patent Literature 7, however, the mixture is solidified by the hydrolysis and polycondensation reaction, so that the vanadium is likely to aggregate and makes it difficult to control the film quality, thus failing to obtain an excellent film. Also, the oxovanadium(V)tri-i-propoxide oxide alone cannot form a coating film and is thus mixed with the hole transporting polymer, so that the coating film of Patent Literature 7 inevitably has a high organic component concentration and an insufficient vanadium concentration, the vanadium being considered to be an active substance for device lifetime. As a result, a further improvement in device lifetime properties and device properties are required of Patent Literature 7.

In the case of the reaction product of the molybdenum complex disclosed in Patent Literature 10, the reaction product has insufficient solvent solubility in aromatic hydrocarbons solvent, which is a good solvent of hole transporting high-molecular compounds, so that the reaction product of the molybdenum complex is sometimes likely to aggregate. Also, it is possible that an organic solvent having unreacted carbonyl groups or hydroxyl groups is mixed with a reaction product of the organic solvent and have adverse effects on device lifetime.

Film forming properties and thin film stability are largely concerned with device lifetime properties. In general, the lifetime of organic EL devices is determined as the time to half-luminance of organic EL devices when the devices are continuously driven under a constant current condition, etc., and it is considered that the longer the time to half-luminance of a device, the longer the driving lifetime.

The present invention was achieved in light of the above circumstances. An object of the present invention is to provide a material for hole injection transport layers and a production method thereof, the material being capable of forming a hole injection transport layer by the solution application method and increasing device lifetime; an ink for forming hole injection transport layers and a production method thereof, the ink being capable of forming a hole injection transport layer by the solution application method and increasing device lifetime; and a long-life device and a production method thereof.

Solution to Problem

As a result of diligent researches, the inventors of the present invention have found that by using a reaction product of a molybdenum complex with a specific compound as a material for hole injection transport layers, it is possible to form a hole injection transport layer by the solution application method and to increase device lifetime.

The present invention was completed based on this finding.

The material for hole injection transport layers is a reaction product of a molybdenum complex with a compound represented by the following chemical formula (1).

Also, the method for producing a material for hole injection transport layers according to the present invention, comprises steps of: obtaining a reaction product by heating a mixture of a molybdenum complex and a compound represented by the following chemical formula (1); and removing the compound remaining unreacted from a reaction solution.

Chemical Formula (1)

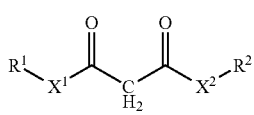

In this formula, $R^1$ and $R^2$ each independently represent a hydrocarbon group which can have a substituent or contain a heteroatom; $X^1$ and $X^2$ each independently represent an oxygen atom, sulfur atom or direct bond; and a total of carbon numbers of $R^1$ and $R^2$ is 5 or more.

The ink for forming hole injection transport layers according to the present invention, comprises the material for hole injection transport layers according to the present invention and an aromatic hydrocarbon solvent.

The method for producing an ink for forming hole injection transport layers according to the present invention, comprises a step of dissolving the material for hole injection transport layers according to the present invention in an aromatic hydrocarbon solvent, or dissolving a material for hole injection transport layers obtained by the method for producing an ink for forming hole injection transport layers according to the present invention, in an aromatic hydrocarbon solvent.

The device of the present invention comprises a substrate, two or more electrodes and a hole injection transport layer, the electrodes facing each other on the substrate and the hole injection transport layer being present between two of the electrodes, wherein the hole injection transport layer comprises the material for hole injection transport layers according to the present invention.

The method for producing a device according to the present invention, comprises a substrate, two or more electrodes and a hole injection transport layer, the electrodes facing each other on the substrate and the hole injection transport layer being present between two of the electrodes, the method comprising a step of forming the hole injection transport layer on any one of layers on the electrodes, by using the ink for forming hole injection transport layers according to the present invention or by using an ink for forming hole injection transport layers obtained by the method for producing an ink for forming hole injection transport layers according to the present invention.

Advantageous Effects of Invention

According to the present invention, it is possible to provide the following: a material for hole injection transport layers and a production method thereof, the material being capable of forming a hole injection transport layer by the solution application method and increasing device lifetime; an ink for forming hole injection transport layers and a production method thereof, the ink being capable of forming a hole injection transport layer by the solution application method and increasing device lifetime; and a long-life device and a production method thereof.

DESCRIPTION OF EMBODIMENTS

Figure 1:
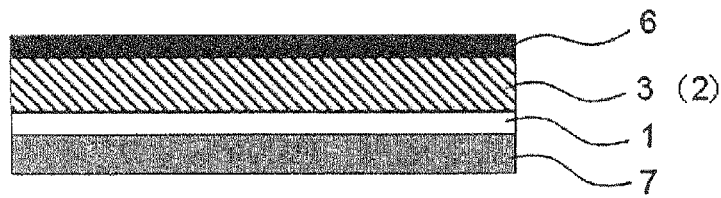
FIG. 1 is a schematic sectional view showing a basic layer configuration of the device of the present invention.

1. Material for Hole Injection Transport Layers and Method for Producing the Material The material for hole injection transport layers according to the present invention is a reaction product of a molybdenum complex with a compound represented by the following chemical formula (1):

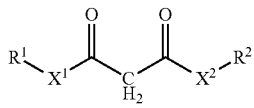

Chemical Formula (1)

wherein $R^1$ and $R^2$ each independently represent a hydrocarbon group which can have a substituent or contain a heteroatom; $X^1$ and $X^2$ each independently represent an oxygen atom, sulfur atom or direct bond; and a total of carbon numbers of $R^1$ and $R^2$ is 5 or more.

A device that has a hole injection transport layer comprising the material for hole injection transport layers according to the present invention, has better hole injection properties and a longer device lifetime.

The material for hole injection transport layers according to the present invention is a reaction product of a molybdenum complex with a compound represented by the above chemical formula (1); therefore, the material can form a highly stable film that is able to form a charge transfer complex, to improve hole injection properties, and has excellent adhesion to adjacent electrodes or organic layers, so that the material can achieve a longer device lifetime. Also, the material of the present invention can form the hole injection transport layer by using the solution application method. In this case, even though the production process is simple, a longer device lifetime can be achieved.

The reason why the reaction product of the molybdenum complex that is used for the device of the present invention can increase device lifetime, as described above, is presumed as follows. That is, the molybdenum complex is highly active. Each molybdenum complex can form a reaction product with other molybdenum complex through an oxidation-reduction reaction with the compound represented by the above chemical formula (1), can form a reaction product having a structure in which the compound represented by the above chemical formula (1) is coordinated therewith, and can form a mixture or composite body of these reaction products.

The reaction product of the molybdenum complex is likely to form a charge transfer complex with a hole transporting compound or with other reaction products of the complexes. Therefore, it is presumed that the reaction product can efficiently improve the charge injection transport ability of the hole injection transport layer and can increase device lifetime. Especially, because the reaction product of the molybdenum complex of the present invention is a reaction product with the compound represented by the chemical formula (1) having the above-specified structure, the compound represented by the chemical formula (1) is incorporated into the reaction product and it is presumed that there is an increase in solvent solubility and affinity for hole transporting compounds. Especially, there is an increase in solubility in solvent which is a good solvent of hole transporting compounds and which is less likely to have adverse effects on the device performance, such as a solubility in aromatic hydrocarbon solvents. It is presumed that such a solvent solubility or affinity for hole transporting compounds which may coexist is increased, and the reaction products of the molybdenum complexes are resistant to aggregation, so that there is an increase in dispersibility or dispersion stability in coating films, and it becomes possible to effectively improve the charge injection transport ability of the hole injection transport layer, thus improving device lifetime.

Also, unlike the oxides of inorganic compounds, the reaction products of complexes can control their charge injection properties or charge transport properties by the valence or ligands of metals. However, in the case of the reaction product with the compound represented by the chemical formula (1), it is assumed that there is a possible improvement in charge injection properties or charge transport properties.

In addition, the compounds represented by the chemical formula (1) are less likely to cause polymerization, etc., and after forming the reaction product, it is easy to remove the unreacted compounds represented by the chemical formula (1) from the reaction solution, so that there are less adverse effects on the device performance than ever before. Due to the above synergistic effects, the material for hole injection transport layers of the present invention, which is a reaction product of the molybdenum complex, is presumed to be able to realize a longer-life device, especially.

(Molybdenum Complex)

The molybdenum complex used in the present invention is a coordination compound containing molybdenum, and it also contains a ligand, in addition to molybdenum. As the molybdenum complex, there may be mentioned complexes having an oxidation number of −2 to +6.

The ligand type is appropriately selected and is not particularly limited. However, from the viewpoint of compatibility with the compound represented by the chemical formula (1), the complex preferably contains a carbon atom, and it is more preferable that the complex contains a carbon atom and an oxygen atom. The ligand is preferably one that is decomposable from the complex at a relatively low temperature of 200° C. or less, for example.

Examples of monodentate ligands include acyl, carbonyl, thiocyanate, isocyanate, cyanate, isocyanate and a halogen atom. Preferred is carbonyl which is decomposable at relatively low temperature.

Specific examples of structures containing at least one of an aromatic ring and a heterocyclic ring, include benzene, triphenylamine, fluorene, biphenyl, pyrene, anthracene, carbazole, phenylpyridine, trithiophene, phenyloxadiazole, phenyltrizaole, benzimidazole, phenyltriazine, benzothiadiazine, phenylquinoxaline, phenylenevinylene, phenylsilole and combinations of these structures.

To the extent that does not impair the effects of the present invention, the structure containing at least one of an aromatic ring and a heterocyclic ring, can have a substituent. As the substituent, for example, there may be mentioned a straight- or branched-chain alkyl group having a carbon number of 1 to 20, a halogen atom, an alkoxy group having a carbon number of 1 to 20, a cyano group, a nitro group, etc. Among straight- or branched-chain alkyl group having a carbon number of 1 to 20, preferred are straight- or branched-chain alkyl group having a carbon number of 1 to 12, such as a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group and a dodecyl group.

As the ligand, preferred is a monodentate ligand or bidentate ligand, from the viewpoint of increasing the reactivity of the molybdenum complex. When the complex itself becomes too stable, the reactivity of the complex may be inferior.

Molybdenum complexes having an oxidation number of 0 or less include metal carbonyls such as $[Mo^{-II}(CO)_5]^{2-}$, $[(CO)_5Mo^{-I}Mo^{-I}(CO)_5]^{2-}$ and $[Mo(CO)_6]$.

Examples of molybdenum(I) complexes having an oxidation number of +1 include non-Werner-type complexes such as diphosphane and $\eta^5$-cyclopentadienide. Specific examples thereof include $Mo^I(\eta^6\text{-}C_6H_6)_2]^+$ and $[MoCl(N_2)(diphos)_2]$. As used herein, "diphos" is $(C_6H_5)_2PCH_2CH_2P(C_6H_5)_2$ of a bidentate ligand.

Molybdenum(II) complexes having an oxidation number of +2 include $Mo_2$ compounds such that molybdenum is a binuclear complex and is present in the state of $(Mo_2)^{4+}$ ions. For example, there may be mentioned $[Mo_2(RCOO)_4]$ and $[Mo_2X_2L_2(RCOO)_4]$. "R" in RCOO is a hydrocarbon group which may have a substituent, and there may be used various kinds of carboxylic acids. Examples of carboxylic acids include fatty acids such as a formic acid, acetic acid, propionic acid, butyric acid and valeric acid; halogenated alkylcarboxylic acid such as a trifluoromethanecarboxylic acid; aromatic hydrocarbon carboxylic acids such as a benzoic acid, naphthalenecarboxylic acid, anthracenecarboxylic acid, 2-phenyl propionic acid, cinnamic acid and fluorenecarboxylic acid; and heterocyclic carboxylic acids such as a furancarboxylic acid, thiophencarboxylic acid and pyridinecarboxylic acid. Also, there may be mentioned carboxylic acids as described below, which have a structure in which a hole transporting compound such as an arylamine derivative, carbazole derivative, thiophene derivative, fluorene derivative or distyrylbenzene derivative, has a carboxylic group. Particularly, a structure in which at least one of aromatic and heterocyclic rings as described above is contained in a carboxylic acid, is particularly suitably used. Carboxylic acids offer many options, and they are ligands that are suitable for optimizing interaction with the hole transporting compound mixed together, optimizing hole injection transport functions and optimizing adhesion to adjacent layers. "X" is halogen or alkoxide and there may be used chlorine, bromine, iodine, methoxide, ethoxide, isopropoxide, sec-butoxide or tert-butoxide. "L" is a neutral ligand and there may be used trialkylphosphines such as $P(n\text{-}C_4H_9)_3$ and $P(CH_3)_3$, and triarylphosphines such as triphenylphosphine.

As the molybdenum(II) complex having an oxidation number of +2, moreover, there may be used halogen complexes such as $[Mo^{II}_2X_4L_4]$ and $[Mo^{II}_2X_2L_4]$. For example, there may be mentioned $[Mo^{II}Br_4(P(n\text{-}C_4H_9)_3)_4]$ and $[Mo^{III}_2(diars)_2]$. As used herein, "diars" is $(CH_3)_2As\text{—}C_6H_4\text{—}As(CH_3)_2$, which is diarsine.

Examples of molybdenum(III) complexes having an oxidation number of +3 include $[(RO)_3Mo\equiv Mo(OR)_3]$ and $[Mo(CN)_7(H_2O)]^{4-}$. "R" is a straight- or branched-chain alkyl group having a carbon number of 1 to 20. Of straight- or branched-chain alkyl groups having a carbon number of 1 to 20, preferred are straight- or branched-chain alkyl groups having a carbon number of 1 to 12, such as a methyl group, ethyl group, propyl group, isopropyl group, butyl group, isobutyl group, sec-butyl group, tert-butyl group, pentyl group, hexyl group, heptyl group, octyl group, nonyl group, decyl group, undecyl group and dodecyl group.

Examples of molybdenum(IV) complexes having an oxidation number of +4 include $[Mo\{N(CH_3)_2\}_4]$ and $[Mo(CN)_8]^{4-}$. In addition, there may be mentioned a complex of $MoO_2^+$ having an oxo ligand and a complex of $Mo_2O_2^{4+}$ doubly-bridged with $O^{2-}$.

Examples of molybdenum(V) complexes having an oxidation number of +5 include $[Mo(CN)_8]^{3-}$, an oxo complex having binuclear $Mo_2O_3^{4+}$ in which Mo=O is bridged with $O^{2-}$ in the trans position, such as a xanthogenic acid complex $Mo_2O_3(S_2COC_2H_5)_4$, and an oxo complex having binuclear $Mo_2O_4^{2+}$ in which Mo=O is doubly-bridged with $O^{2-}$ in the cis position, such as a histidine complex $[Mo_2O_4(L\text{-histidine})_2]\cdot3H_2O$.

Examples of molybdenum(VI) complexes having an oxidation number of +6 include $MoO_2(acetylacetonate)_2]$.

In the case of binuclear or higher complexes, there may be mentioned mixed valence complexes.

From the viewpoint of decreasing driving voltage and increasing device lifetime, a preferred reaction product of molybdenum complexes is a composite body composed of a molybdenum having an oxidation number of +5 and a molybdenum having an oxidation number of +6. Also, from the viewpoint of decreasing driving voltage and increasing device lifetime, the reaction product of molybdenum complexes is preferably present in the form of the composite body in the anion state, the composite body being composed of a molybdenum having an oxidation number of +5 and one having an oxidation number of +6.

In the case of the composite body composed of a molybdenum having an oxidation number of +5 and one having an oxidation number of +6, from the viewpoint of decreasing driving voltage and increasing device lifetime, it is preferable that the molybdenum having an oxidation number of +5 is 10 mole or more, relative to 100 mole of the molybdenum having an oxidation number of +6.

(Compound Represented by the Chemical Formula (1))

In the present invention, the compound to be reacted with the molybdenum complex is a compound represented by the following chemical formula (1). The compound represented by the chemical formula (1) has a β-diketone structure and the total of carbon numbers of terminals is 5 or more; therefore, the compound is highly reactive with the molybdenum complexes, and the reaction product having the compound incorporated therein, is has high solvent solubility.

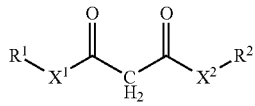

Chemical Formula (1)

wherein $R^1$ and $R^2$ each independently represent a hydrocarbon group which can have a substituent or contain a heteroatom; $X^1$ and $X^2$ each independently represent an oxygen atom, sulfur atom or direct bond; and a total of carbon numbers of $R^1$ and $R^2$ is 5 or more.

As the hydrocarbon groups represented by $R^1$ and $R^2$, there may be mentioned a straight-chain, branched-chain or cyclic, saturated or unsaturated aliphatic hydrocarbon group, a monocyclic or polycyclic aromatic group, or combinations thereof. As the heteroatom, an oxygen atom, sulfur atom, nitrogen atom, etc., can be contained.

Examples of the substituent the hydrocarbon groups represented by $R^1$ and $R^2$ can have, include the following: a halogen atom; alkoxy groups such as a methoxy group; cycloalkoxy groups such as a cyclohexyloxy group; aryloxy groups such as a phenoxy group; alkylthio groups such as a methylthio group; arylthio groups such as a phenylthio group; and acyloxy groups such as an acetyl group.

Examples of the hydrocarbon groups represented by $R^1$ and $R^2$ include, but not limited to, the following: alkyl groups such as a methyl group; cycloalkyl groups such as a cyclopentyl group; alkenyl groups such as a vinyl group; alkynyl groups such as an ethynyl group; aryl groups such as a phenyl group; aromatic heterocyclic groups such as a pyridyl group; aliphatic heterocyclic groups such as a pyrrolidyl group; arylalkyl groups such as a benzyl group; and alkylaryl groups such as a 1,3,5-trimethylphenyl group.

Examples of the hydrocarbon groups having a substituent represented by $R^1$ and $R^2$ include, but not limited to, the following: halogenated hydrocarbon groups including fluorohydrocarbon groups such as a heptafluoropropyl group; alkoxyalkyl groups such as a methoxymethyl group; alkoxyaryl groups such as a methoxyphenyl group; aryloxyalkyl groups such as a phenoxymethyl group; alkylthioalkyl groups such as a methylthiomethyl group; alkylthioaryl groups such as a methylthiophenyl group; arylthioalkyl groups such as a phenylthiomethyl group; acylalkyl groups such as an acetylmethyl group; acylaryl groups such as an acetylphenyl group; acyloxyalkyl groups such as an acetoxypropyl group; and acyloxyaryl groups such as an acetoxyphenyl group.

In the present invention, it is preferable that at least one of $R^1$ and $R^2$ has a carbon number of 4 or more, from the point of view that it is possible to increase device lifetime and it is easy to form the hole injection transport layer by the solution application method. As used herein, the carbon number includes the carbon number of the substituent.

It is particularly preferable that at least one of $R^1$ and $R^2$ contains an aliphatic hydrocarbon group and has a carbon number of 4 or more. In particular, it is preferable that at least one of $R^1$ and $R^2$ has a carbon number of 4 or more and is one or more kinds selected from the group consisting of a straight-chain, branched-chain or cyclic, saturated or unsaturated aliphatic hydrocarbon group, an alkoxyalkyl group, an alkoxyaryl group, an aryloxyalkyl group, an alkylthioalkyl group, an alkylthioaryl group, an arylthioalkyl group, an acylalkyl group, an acylaryl group, an acyloxyalkyl group and an acyloxyaryl group. When at least one of $R^1$ and $R^2$ contains an aliphatic hydrocarbon group and has a carbon number of 4 or more, there is an increase in solvent solubility, compatibility with the hole transporting compound, so that the hole injection transport layer can be readily formed by the solution application method, and there is an increase in device lifetime. It is particularly preferable that the total carbon number of $R^1$ and $R^2$ is 8 or more.

It is also preferable that the compound represented by the chemical formula (1) contains an oxy group or a thio group per molecule, from the viewpoint of increasing solvent solubility and increasing device lifetime.

$X^1$ and $X^2$ each independently represent an oxygen atom, sulfur atom or direct bond. From the viewpoint of increasing device lifetime, $X^1$ and $X^2$ are each preferably an oxygen atom or direct bond, more preferably a direct bond.

In the present invention, the compound represented by the chemical formula (1) is a raw material for reaction products; however, it is preferable that the compound functions as a solvent for the molybdenum complex. In particular, the compound represented by the chemical formula (1) preferably dissolves 1% by mass or more of the molybdenum complex at 25° C., more preferably 5% by mass or more of the molybdenum complex, still more preferably 10% by mass or more of the molybdenum complex. In this case, in the step of obtaining the reaction product, other solvent is not needed or a reaction can be caused by adding a small amount of other solvent, resulting in an increase in reaction efficiency and an increase in device lifetime.

The compound represented by the chemical formula (1) is preferably liquid at 25° C. However, the compound is not limited to one which is liquid at 25° C.

From the point of view that it is easy to function as the solvent for the molybdenum complex at the time of synthesis reaction, the compound represented by the chemical formula (1) preferably has a melting point of 150° C. or less, more preferably 80° C. or less. Also, the compound preferably has a viscosity of 20 mPa·s or less.

As the compound represented by the chemical formula (1), there may be mentioned combinations of $R^1$, $R^2$, $X^1$ and $X^2$.

The compound represented by the chemical formula (1) is commercially available. Moreover, it can be obtained by synthesis, such as a cross-coupling reaction of an acid chloride and a halogenated compound in the presence of a metal catalyst.

(Reaction Product)

In the present invention, the reaction product is presumed to be a reaction product in which each complex has reacted with other complex through an oxidation-reduction reaction with the compound represented by the chemical formula (1), a reaction product having a structure with which the compound represented by the chemical formula (1) is coordinated, or a mixture or composite body of these reaction products. It is presumed that at least a portion of the reaction product has a structure derived from the compound represented by the chemical formula (1).

Also in the present invention, the reaction product is preferably a molybdenum oxide. The molybdenum oxide is obtained by allowing a mixture of the molybdenum complex and the compound represented by the chemical formula (1) to undergo an oxidization process. Examples of the oxidization process include a heating process, a light irradiation process and a process of using active oxygen. These processes can be used in combination. In the present invention, however, natural oxidation in the atmosphere is also allowed.

Also in the material for hole injection transport layers according to the present invention, it is preferable that 0.1% by mass or more of the material is dissolved in at least one kind of aromatic hydrocarbon solvent selected from the group consisting of toluene, xylene, anisole and mesitylene, at 25° C., from the point of view that it is easy to form the hole injection transport layer by the solution application method and that since the aromatic hydrocarbon solvents are good solvents for hole transporting compounds and are solvents that are less likely to have adverse effects on device performance, a long-life device can be obtained.

(Method for Producing the Material for Hole Injection Transport Layers)

The method for producing a material for hole injection transport layers according to the present invention, comprises steps of: obtaining a reaction product by heating a mixture of a molybdenum complex and a compound represented by the following chemical formula (1); and removing the compound remaining unreacted from a reaction solution:

Chemical Formula (1)

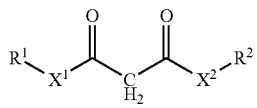

wherein $R^1$ and $R^2$ each independently represent a hydrocarbon group which can have a substituent or contain a heteroatom; $X^1$ and $X^2$ each independently represent an oxygen atom, sulfur atom or direct bond; and a total of carbon numbers of $R^1$ and $R^2$ is 5 or more.

<Step of Obtaining the Reaction Product>

In this step, first, a mixture is prepared by mixing a molybdenum complex and the compound represented by the chemical formula (1). As described above, the compound represented by the chemical formula (1) preferably functions as a solvent for the molybdenum complex, and it is preferable that the mixture contains substantially no organic solvents different from the compound represented by the chemical formula (1). In this case, in the step of obtaining the reaction product, there is an increase in reaction efficiency and an increase in device lifetime. As used herein, "contains/contain substantially no" means that only 1.0% by mass or less is contained in the mixture. However, in the case of using a complex which is likely to sublimate as the molybdenum complex, it is preferable to react the complex and compound by adding a small amount of aromatic hydrocarbon solvent or the like thereto and with refluxing them, from the viewpoint of an increase in yield. From the matters explained above, it is preferable that the compound represented by the chemical formula (1) is a solvent for the molybdenum complex, and an organic solvent contained in the mixture and different the compound represented by the chemical formula (1) accounts for only 10.0% mass or less of the mixture.

The content of the compound represented by the chemical formula (1) is preferably 200 parts by mass to 1,000 parts by mass, relative to 100 parts by mass of the molybdenum complex, from the viewpoint of increasing reaction efficiency.

The heating temperature is not particularly limited. However, it is generally about 100° C. to 200° C., and from the viewpoint of preventing side reactions, it is preferably 120° C. to 160° C. It is preferable to appropriately control the heating temperature, since the heating temperature makes a difference in the reactivity of the molybdenum complex, the interaction between the molybdenum complexes, and the interaction of the molybdenum complex with the hole transporting compound. The pressure applied upon the heating is not particularly limited. However, it is preferably ordinary pressure to 0.1 MPa, and more preferably ordinary pressure. The heating time depends on the synthesis amount, reaction temperature, etc. However, it is generally set in the range of 0.1 to 24 hours, preferably in the range of 1 to 10 hours.

The heating is preferably performed under a deoxygenated atmosphere such as argon atmosphere or nitrogen atmosphere, from the viewpoint of preventing side reactions. Even under an argon atmosphere or nitrogen atmosphere, the mixture can be oxidized by remaining oxygen. An indication of the argon atmosphere or nitrogen atmosphere is, for example, preferably a state that argon or nitrogen has been introduced therein after air is exhausted to about $10^{-1}$ Pa.

As the heating means, for example, there may be mentioned heating by an oil bath or heating mantle.

The method can further comprise a light irradiation step or a step of using active oxygen, upon producing the reaction production.

In the case of using the light irradiation step, as the light irradiation means, there may be mentioned ultraviolet irradiation, etc. It is preferable to appropriately control the amount of irradiated light, since the amount makes a difference in the reactivity of the molybdenum complex, the interaction between the molybdenum complexes, and the interaction of the molybdenum complex with the hole transporting compound.

In the case of using the step of using active oxygen, as the means for using active oxygen, there may be mentioned a method of generating active oxygen by ultraviolet and using the generated active oxygen, a method of generating active oxygen by exposing ultraviolet to a photocatalyst such as titanium oxide and using the generated active oxygen, etc. It is preferable to appropriately control the active oxygen amount, since the amount makes a difference in the reactivity of the molybdenum complex, the interaction between the molybdenum complexes, and the interaction of the molybdenum complex with the hole transporting compound.

<Step of Removing the Compound Remaining Unreacted from a Reaction Solution>

To remove the compound remaining unreacted from a reaction solution, for example, there may be mentioned a heating method, separation by column chromatography, etc.

The heating temperature is not particularly limited. However, it is generally about 40° C. to 200° C., preferably 60° C. to 150° C. The pressure applied upon the heating is not particularly limited. However, it is preferable that the heating is performed under a reduced pressure of 0.1 MPa or less. The heating time can be appropriately determined since it can vary depending on the amount of the reaction solution obtained.

By removing the compound remaining unreacted from the reaction solution obtained by the above step, a reaction product with high purity can be obtained and there is an increase in device lifetime.

2. Ink for Forming Hole Injection Transport Layers and Method for Producing the Ink The ink for forming hole injection transport layers according to the present invention comprises the material for hole injection transport layers according to the present invention and an aromatic hydrocarbon solvent.

The ink for forming hole injection transport layers according to the present invention, can form a hole injection transport layer by the solution application method and can provide a long-life device.

As described above, the ink for forming hole injection transport layers according to the present invention, can form a charge transfer complex and has improved hole injection properties and increased solubility in organic solvents. Accordingly, it is presumed that when mixed with an aromatic hydrocarbon solvent to prepare the ink for forming hole injection transport layers, the material for hole injection transport layers according to the present invention is homogenously dissolved or dispersed and is resistant to aggregation in the ink or coating film. Therefore, even by the solution application method using an aromatic hydrocarbon solvent, a hole injection transport layer in which the material for hole injection transport layers is homogenously dispersed can be obtained, so that it is presumed there is an improvement in hole injection transport properties and an increase in the lifetime of a device comprising the hole injection transport layer.

Also, in the ink for forming hole injection transport layers according to the present invention, an aromatic hydrocarbon solvent is used as the solvent. Therefore, after a coating film, which is the hole injection transport layer, is formed by the solution application method, the solvent can be readily removed from the coating film, or the solvent is less likely to have adverse effects on devices even if the solvent remains in the coating film. Therefore, it is presumed that the solvent, which will be an impurity, has less effects on the hole injection transport layer thus obtained and a long-life device can be obtained.

The ink for forming hole injection transport layers according to the present invention comprises at least the material for hole injection transport layers and the aromatic hydrocarbon solvent, and it can further contain other components, as needed.

Hereinafter, the components of the ink for forming hole injection transport layers will be described. The material for hole injection transport layers is as described above and will not be described below.

(Aromatic Hydrocarbon Solvent)

In the present invention, the aromatic hydrocarbon solvent is not particularly limited. From a viewpoint of obtaining the hole injection transport layer in which the material for hole injection transport layer is homogenously dispersed, preferred is a solvent which dissolves 0.1% by mass or more of the material for hole injection transport layers according to the present invention at 25° C. Also from the point of view that the solvent is less likely to be dissolved in the hole injection transport layer and a long-life device can be obtained, it is preferable to use a solvent having a boiling point of 250° C. or less.

Examples of such aromatic hydrocarbon solvents include toluene, xylene, anisole and mesitylene.

(Hole Transporting Compound)

It is preferable that the ink for forming hole injection transport layers according to the present invention further comprises a hole transporting compound, from the viewpoint of high film stability and an improvement in hole transporting ability.

The hole transporting compound is not particularly limited, and compounds having hole transporting properties can be appropriately used. As used herein, "hole transporting properties" means that overcurrent induced by hole transport is observed by a known photocurrent method.

As the hole transporting compound, high-molecular compound can be suitably used, as well as low-molecular compounds. A hole transporting high-molecular compound is a high-molecular compound which has hole transporting properties and a mass average molecular weight of 2,000 or more, which is a polystyrene equivalent molecular weight obtained by gel permeation chromatography. In the hole injection transport layer of the present invention, in order to form a stable film by the solution application method, it is preferable to use a high-molecular compound as the hole transporting material, the compound which is highly soluble in organic solvents and which is able to form a stable coating film in which the compound is less likely to aggregate.

The hole transporting compound is not particularly limited. Examples thereof include an arylamine derivative, an anthracene derivative, a carbazole derivative, a thiophene derivative, a fluorene derivative, a distyrylbenzene derivative and a spiro compound.

As the hole transporting high-molecular compound, for example, there may be mentioned polymers each comprising any one of the following in its repeating unit: an arylamine derivative, an anthracene derivative, a carbazole derivative, a thiophene derivative, a fluorene derivative, a distyrylbenzene derivative, a Spiro compound, etc.

As the hole transporting high-molecular compound, preferred is a compound represented by the following general formula (2), from the point of view that it is easy to obtain excellent adhesion stability to adjacent organic layers and HOMO energy value is between an anode substrate and a light emitting layer material:

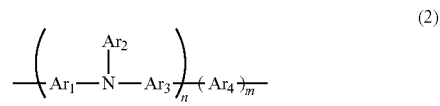

(2)

when $Ar_1$ to $Ar_4$ can be identical to or different from each other; each of $Ar_1$ to $Ar_4$ is an unsubstituted or substituted aromatic hydrocarbon group having 6 to 60 carbon atoms that relate to conjugate bonding, or is an unsubstituted or substituted heterocyclic group having 4 to 60 carbon atoms that relate to conjugate bonding; n is 0 to 10,000; m is 0 to 10,000; n+m=10 to 20,000; and the sequence of the two repeating units can be any sequence.

The order of the two repeating units can be any order and can be any one of a random copolymer, an alternating copolymer, a periodic copolymer and a block copolymer.

The average of "n" is preferably 5 to 5,000, more preferably 10 to 3,000. The average of "m" is preferably 5 to 5,000, more preferably 10 to 3,000. The average of "n+m" is preferably 10 to 10,000, more preferably 20 to 6,000.

When $Ar_1$ to $Ar_4$ in the general formula (2) are each an aromatic hydrocarbon group, specific examples of the aromatic hydrocarbon in the aromatic hydrocarbon group include benzene, fluorene, naphthalene, anthracene, combinations thereof, derivatives thereof, a phenylenevinylene derivative and a styryl derivative. When $Ar_1$ to $Ar_4$ in the general formula (2) are each a heterocyclic group, specific examples of the heterocyclic ring in the heterocyclic group include thiophene, pyridine, pyrrole, carbazole, combinations thereof and derivatives thereof.

When $Ar_1$ to $Ar_4$ in the general formula (2) has a substituent each, the substituent is preferably a straight- or branched-chain, alkyl or alkenyl group having a carbon number of 1 to 12, such as a methyl group, ethyl group, propyl group, isopropyl group, butyl group, isobutyl group, sec-butyl group, tert-butyl group, pentyl group, hexyl group, heptyl group, octyl group, nonyl group, decyl group, undecyl group, dodecyl group, vinyl group or allyl group.

As the compound represented by the general formula (2), in particular, the following compound examples are preferable: poly[(9,9-dioctylfluorenyl-2,7-diyl)-co-(4,4'-(N-(4-sec-butylphenyl))diphenylamine)] (TFB) represented by the following formula (3); poly[(9,9-dioctylfluorenyl-2,7-diyl)-alt-co-(N,N'-bis{4-butylphenyl}-benzidine-N,N'-{1,4-diphenylene})] represented by the following formula (4); and poly[(9,9-dioctylfluorenyl-2,7-diyl)] (PM) represented by the following formula (5):

When the hole transporting compound is used in the hole injection transport layer of the present invention, the content of the hole transporting compound is preferably 10 to 10,000 parts by weight, relative to 100 parts by weight of the material for hole injection transport layers according to the present invention, from the viewpoint of improving hole injection transport properties and achieving high film stability and long lifetime.

When the content of the hole transporting compound is too small in the hole injection transport layer, the synergistic effects obtained by the mixing of the hole transporting compound, are less likely to be achieved. On the other hand, when the content of the hole transporting compound is too large, the effect obtained by the use of the material for hole injection transport layers, are less likely to be achieved.

(Additives)

The ink for forming hole injection transport layers according to the present invention can contain additives such as a binder resin, curable resin and coatability improving agent, as long as the effects of the present invention are not impaired. Examples of binder resins include polycarbonate, polystyrene, polyarylate and polyester. Also, the ink can contain a binder resin which is cured by heat, light, etc. Materials that are cured by heat, light, etc., include curable resins and one obtained by incorporating a curable functional group in each molecule of the hole transporting compound. Specific examples of curable functional groups include acrylic functional groups such as an acryloyl group and methacryloyl group, a vinylene group, an epoxy group and an isocyanate group. The curable resin can be a thermosetting resin or photocurable resin. For example, there may be mentioned an epoxy resin, a phenolic resin, a melamine resin, a polyester resin, a polyurethane resin, a silicon resin and a silane coupling agent.

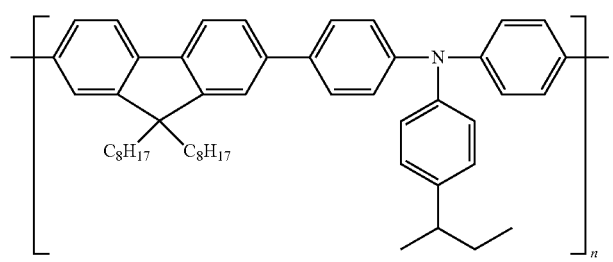

(3)

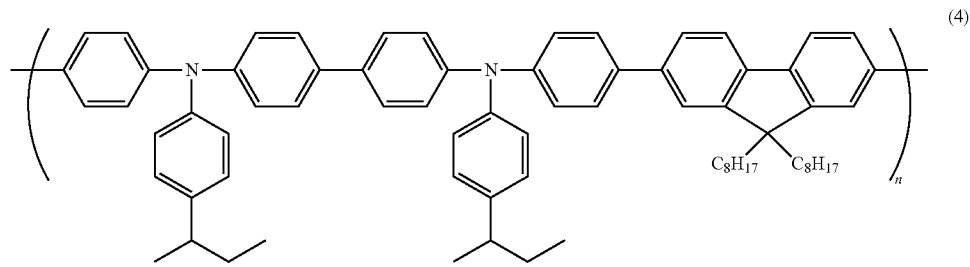

(4)

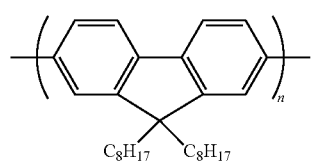

(5)

In the ink for forming hole injection transport layers according to the present invention, the content of the material for hole injection transport layers according to the present invention is generally 0.05 to 20 parts by mass, preferably 0.1 to 10 parts by mass, relative to 100 parts by mass of the aromatic hydrocarbon solvent.

Also, it is preferable that the ink for forming hole injection transport layers according to the present invention is an ink containing substantially no compound represented by the chemical formula (1), from the point of view that a long-life device can be obtained. As used herein, "containing substantially no" means that the ink for forming hole injection transport layers contains only 1.0% by mass or less of the compound represented by the chemical formula (1).

(Method for Producing the Ink for Forming Hole Injection Transport Layers)

The method for producing the ink for forming hole injection transport layers according to the present invention, comprises a step of dissolving the material for hole injection transport layers according to the present invention in an aromatic hydrocarbon solvent, or dissolving a material for hole injection transport layers obtained by the method for producing the ink for forming hole injection transport layers according to the present invention, in an aromatic hydrocarbon solvent.

Preferably, the method is a method for producing the ink for forming hole injection transport layers, comprising steps of: obtaining a reaction product by heating a mixture of a molybdenum complex and a compound represented by the chemical formula (1); preparing the material for hole injection transport layers by removing the compound remaining unreacted from a reaction solution; and dissolving the above-prepared material for hole injection transport layers in an aromatic hydrocarbon solvent.

By the method for producing the ink for forming hole injection transport layers according to the present invention, the ink for forming hole injection transport layers, in which the material for hole injection transport layers is homogenously dissolved in the aromatic hydrocarbon solvent, can be obtained. In the hole injection transport layer formed by using the ink for forming hole injection transport layers, even by the solution application method using the aromatic hydrocarbon solvent, the material for hole injection transport layers is homogenously dispersed, so that a long-life device can be obtained.

The method for dissolving the material for hole injection transport layers in the aromatic hydrocarbon solvent, is not particularly limited. The ink for forming hole injection transport layers can be obtained by adding the material for hole injection transport layers and, as needed, the hole transporting compound and other additives to the aromatic hydrocarbon solvent and then heating or stirring the mixture, as needed.

3. Device and Method for Producing the Device

The device of the present invention comprising a substrate, two or more electrodes and a hole injection transport layer, the electrodes facing each other on the substrate and the hole injection transport layer being present between two of the electrodes, wherein the hole injection transport layer comprises the material for hole injection transport layers according to the present invention.

Because the hole injection transport layer comprises the material for hole injection transport layers according to the present invention, the device of the present invention can improve hole injection properties and achieve a longer lifetime, as described above. Also, it is possible to form the hole injection transport layer by using the solution application method. In this case, even though the production process is simple, a long lifetime can be achieved.

Hereinafter, the layer configuration of the device of the present invention, will be explained.

The device of the present invention comprises a substrate, two or more electrodes and a hole injection transport layer, the electrodes facing each other on the substrate and the hole injection transport layer being present between two of the electrodes.

The device of the present invention encompasses not only organic devices including organic EL devices, organic transistors, dye-sensitized solar cells, organic thin-film solar cells and organic semiconductors, but also oxide compound-solar cells and quantum-dot light emitting devices comprising a hole injection transport layer.

FIG. 1 is a schematic sectional view showing a basic layer configuration of the organic device of the present invention. The basic layer configuration of the device of the present invention has the following: a substrate 7, two electrodes 1 and 6 and an organic layer 3, the two electrodes facing each other on the substrate, and the organic layer being present between the two electrodes and comprising at least a hole injection transport layer 2.

The substrate 7 is a support to form layers thereon, which constitute the device. The substrate is not needed to be provided on a surface of the electrode 1 and is just needed to be provide on an outermost surface of the device.

The hole injection transport layer 2 is a layer that comprise at least the material for hole injection transport layers according to the present invention and has at least one of the functions of injection and transport of holes from the electrode 1 to the organic layer 3.

The organic layer 3 is a layer that fulfills, depending on device type, various kinds of functions by hole injection and transport, and it can be a single layer or a layer comprising multiple layers. When the organic layer comprises multiple layers, the organic layer further comprises a layer that serves a main function in the device (hereinafter referred to as "functional layer") and/or a layer that supports the functional layer (hereinafter referred to as "supporting layer"), in addition to the hole injection transport layer. For example, in the case of an organic EL device, a hole transport layer further provided on the hole injection transport layer corresponds to the supporting layer, and a light emitting layer provided on the hole transport layer corresponds to the functional layer.

The electrode 6 is provided in a position where the organic layer 3 comprising the hole injection transport layer 2 is present between the electrode 6 and the electrode 1, the electrodes facing each other. Also as needed, the device can comprise the third electrode (not shown). By applying an electric field between these electrodes, the functions of the device can be expressed.

Figure 2:
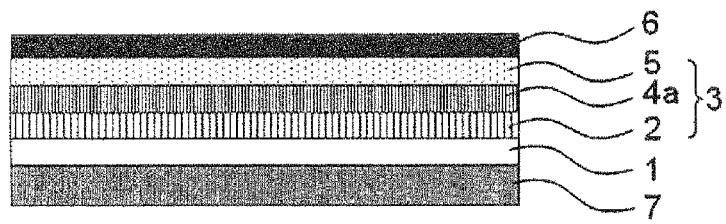
FIG. 2 is a schematic sectional view showing an example of the layer configuration of an organic EL device, which is an embodiment of the device of the present invention.

FIG. 2 is a schematic sectional view showing an example of the layer configuration of an organic EL device, which is an embodiment of the device of the present invention. The organic EL device of the present invention has such an embodiment that the hole injection transport layer 2 is provided on the electrode 1 and a hole transport layer 4a, which serves as the supporting layer, and a light emitting layer 5, which serves as the functional layer, are provided on the hole injection transport layer 2. As just described, in the case of using the hole injection transport layer which is characteristic of the present invention in the position of the hole injection layer, there is an increase in electroconductivity and the hole injection transport layer forms charge transfer complex and becomes insoluble in the solvent used in the solution application method, so that the solution application method can be used even when the hole transport layer, which is an upper layer, is provided thereon. Moreover, an increase in adhesion to the electrodes can be expected.

Figure 3:
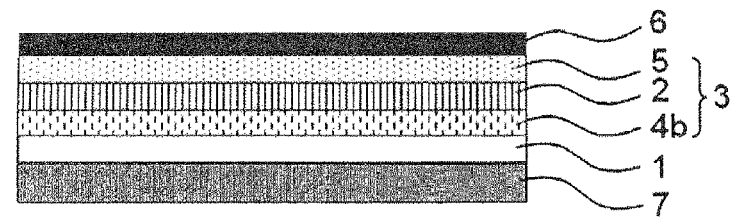
FIG. 3 is a schematic sectional view showing a different example of the layer configuration of an organic EL device, which is an embodiment of the device of the present invention.

FIG. 3 is a schematic sectional view showing a different example of the layer configuration of an organic EL device, which is an embodiment of the device of the present invention. The organic EL device of the present invention has such an embodiment that a hole injection layer 4b is formed on the electrode 1 as the supporting layer and the hole injection transport layer 2 and the light emitting layer 5 are provided on the hole injection layer 4b, the light emitting layer serving as the functional layer. As just described, in the case of using the hole injection transport layer which is characteristic of the present invention in the position of the hole transport layer, there is an increase in electroconductivity and the hole injection transport layer forms charge transfer complexes and becomes insoluble in the solvent used in the solution application method, so that the solution application method can be used even when the light emitting layer, which is an upper layer, is provided thereon.

Figure 4:
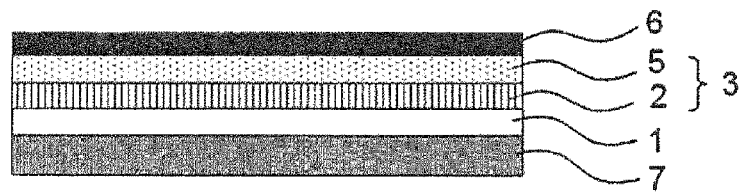
FIG. 4 is a schematic sectional view showing a different example of the layer configuration of an organic EL device, which is an embodiment of the device of the present invention.

FIG. 4 is a schematic sectional view showing a different example of the layer configuration of an organic EL device, which is an embodiment of the device of the present invention. The organic EL device of the present invention has such an embodiment that the hole injection transport layer 2 and the light emitting layer 5, which serves as the functional layer, are stacked in order on the electrode 1. As just described, in the case of using the hole injection transport layer which is characteristic of the present invention as a single layer, there is an advantage to the process, such that the number of steps is reduced.

In FIGS. 2 to 4, each of the hole injection transport layer 2, the hole transport layer 4a and the hole injection layer 4b can be a single layer or a layer comprising multiple layers.

In FIGS. 2 to 4, the electrode 1 serves as the anode, and the electrode 6 serves as the cathode. In the organic EL device, when an electric field is applied between the anode and cathode, holes are transported from the anode through the hole injection transport layer 2 and the hole transport layer 4 and then injected to the light emitting layer 5, and electrons are injected from the cathode to the light emitting layer. Therefore, the injected holes are recombined with the injected electrons, and thus the organic EL device functions to emit light outside the device, To emit light outside the device, all the layers provided on at least one surface of the light emitting layer, are needed to have transparency to light of at least a part of wavelengths in the visible wavelength range. As needed, at least one of an electron transport layer and an electron injection layer (not shown) can be provided between the light emitting layer and the electrode 6 (cathode).

Figure 5:
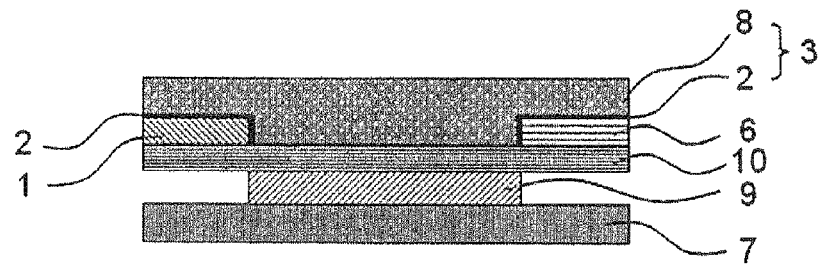
FIG. 5 is a schematic sectional view showing an example of the layer configuration of an organic transistor, which is a different embodiment of the device of the present invention.

FIG. 5 is a schematic sectional view showing an example of the layer configuration of an organic transistor, which is a different embodiment of the device of the present invention. In this organic transistor, the following are provided on the substrate 7: an electrode 9 (gate electrode); the electrode 1 (source electrode) and the electrode 6 (drain electrode), the electrodes facing each other; an organic semiconductor layer 8 provided between the electrodes 9, 1 and 6 as the organic layer; an insulating layer 10 present between the electrodes 9 and 1 and between the electrodes 9 and 6; and the hole injection transport layer 2 formed on the electrodes 1 and 6. The above-described organic transistor functions to control current between the source electrode and the drain electrode, by controlling the charge accumulated in the gate electrode.

Figure 6:
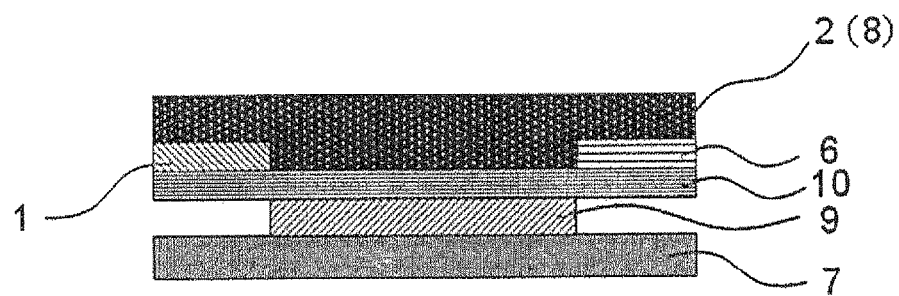
FIG. 6 is a schematic sectional view showing a different example of the layer configuration of an organic transistor, which is a different embodiment of the device of the present invention.

FIG. 6 is a schematic sectional view showing a different example of the layer configuration of an organic transistor, which is a different embodiment of the device of the present invention. In this organic transistor, the following are provided on the substrate 7: the electrode 9 (gate electrode); the electrode 1 (source electrode) and the electrode 6 (drain electrode), the electrodes facing each other; the hole injection transport layer 2 of the present invention, which is formed as the organic layer provided between the electrodes 9, 1 and 6 and serves as the organic semiconductor layer 8; and the insulating layer 10 present between the electrodes 9 and 1 and between the electrodes 9 and 6. In this example, the hole injection transport layer 2 serves as the organic semiconductor layer 8.

The layer configuration of the device of the present invention is not limited to the above-mentioned embodiments. The embodiments are examples, and any that has the substantially same essential features as the technical ideas described in the claims of the present invention and exerts the same effects and advantages is included in the technical scope of the present invention.

Hereinafter, the layers of the device of the present invention will be explained in detail.

(1) Hole Injection Transport Layer

The device of the present invention comprises at least the hole injection transport layer. When the device of the present invention is an organic device and the organic layer is a layer comprising multiple layers, the organic layer further comprises a layer that serves a main function in the device and/or a layer that has a role in supporting the functional layer, in addition to the hole injection transport layer. The functional layer and the supporting layer will be described below in detail, along with concrete examples of the device.

In the device of the present invention, the hole injection transport layer comprises at least the material for hole injection transport layers according to the present invention. In the device of the present invention, the hole injection transport layer can be one comprising only the reaction product of the molybdenum complex and the compound represented by the chemical formula (1). Or, the hole injection transport layer can further comprise other components. From the viewpoint of decreasing driving voltage and increasing device lifetime, it is preferable that the hole injection transport layer further comprises a hole transporting compound. The hole transporting compound can be the same as the one described above under "2. Ink for forming hole injection transport layers and method for producing the ink", so that the compound will not be described below.

In the case of further comprising the hole transporting compound, the hole injection transport layer in the device of the present invention can be a single mixed layer comprising the material for hole injection transport layers according to the present invention and the hole transporting compound, or it can be a layer comprising multiple layers including the mixed layer. Or, the hole injection transport layer can be a stack of multiple layers, which is composed of at least a layer comprising the material for hole injection transport layers and a layer comprising the hole transporting compound. Or, the hole injection transport layer can be a stack of multiple layers, which is composed of at least a layer comprising the material for hole injection transport layers and a layer comprising at least the material for hole injection transport layers and the hole transporting compound.

The hole injection transport layer according to the present invention can contain additives such as a binder resin, curable resin and coatability improving agent, as long as the effects of the present invention are not impaired. Examples of binder resins include polycarbonate, polystyrene, polyarylate and polyester. Also, the ink can contain a binder resin which is cured by heat, light, etc. Materials that are cured by heat, light, etc., include curable resins and one obtained by incorporating a curable functional group in each molecule of the hole transporting compound. Specific examples of curable functional groups include acrylic functional groups such as an acryloyl group and methacryloyl group, a vinylene group, an epoxy group and an isocyanate group. The curable resin can be a thermosetting resin or photocurable resin. For example, there may be mentioned an epoxy resin, a phenolic resin, a melamine resin, a polyester resin, a polyurethane resin, a silicon resin and a silane coupling agent.

The thickness of the hole injection transport layer can be appropriately determined, depending on the purpose of adjacent layers. However, the thickness is generally 0.1 to 1,000 nm, preferably 1 to 500 nm.

Also, the work function of the hole injection transport layer is preferably 5.0 to 6.0 eV, more preferably 5.0 to 5.8 eV, from the viewpoint of hole injection efficiency.

(2) Substrate

The substrate serves as a support of the device of the present invention. It can be made of a flexible material or rigid material, for example. Specific examples of applicable materials include glass, quartz, polyethylene, polypropylene, polyethylene terephthalate, polymethacrylate, polymethyl methacrylate, polymethyl acrylate, polyester and polycarbonate.

Of them, in the case of using a substrate made of a synthetic resin, the substrate preferably has gas barrier properties. The thickness of the substrate is not particularly preferred; however, it is generally about 0.5 to 2.0 mm.

(3) Electrodes

The device of the present invention comprises two or more electrodes facing each other on the substrate.

In the device of the present invention, the electrodes are preferably formed with a metal or metal oxide. Known materials can be appropriately used. The electrodes can be generally formed with a metal such as aluminum, gold, silver, nickel, palladium or platinum, or with a metal oxide such as an oxide containing at least one of indium and tin.

In general, each of the electrodes is often formed on the substrate by a method such as a sputtering method or vacuum deposition method. However, they can be formed by a wet method such as an application method or dipping method. The thicknesses of the electrodes vary depending on transparency, etc., required of each electrode. When transparency is required, the light transmittance in the visible wavelength range of the electrodes, is generally 60% or more, preferably 80% or more. In this case, the thickness of the electrodes is generally about 10 to 1,000 nm, preferably about 20 to 500 nm.

In the present invention, to increase adhesion stability to charge injection materials, a metal layer can be present on the electrode. The metal layer is a layer containing a metal and formed from a metal or metal oxide as described above, which is generally used for electrodes.

(4) Others

In the device of the present invention, as needed, at least one of a generally-known electron injection layer and electron transport layer can be present between the electron injection electrode and the hole injection transport layer.

Hereinafter, embodiments of the device of the present invention, which are an organic EL device and an organic transistor, will be explained. The device of the present invention is not limited to the embodiments.

<Organic EL Device>

An embodiment of the device of the present invention is an organic EL device comprising at least a hole transport injection layer comprising the material for hole injection transport layers according to the present invention, and an organic layer comprising a light emitting layer.

Hereinafter, by way of FIGS. 2 to 4, the layers constituting the organic EL device will be explained in order.

(Substrate)

The substrate 7 serves as a support of the organic EL device. It can be made of a flexible material or rigid material, for example. In particular, for example, there may be used those mentioned above in the description of the substrate of the device.

When the light emitted from the light emitting layer 5 passes through the substrate 7 side and then is taken out, at least the substrate 7 is needed to be made of a transparent material.

(Anode and Cathode)

Depending on the direction in which the light emitted from the light emitting layer 5 is taken out, it is determined which of the electrodes 1 and 6 is needed to have transparency. When the light is taken out from the substrate 7 side, it is needed to form the electrode 1 with a transparent material. When the light is taken out from the electrode 6 side, it is needed to form the electrode 6 with a transparent material.

The electrode 1 provided on the light emitting layer side of the substrate 7, functions as an anode that injects holes to the light emitting layer. The electrode 6 provided on the light emitting layer side of the substrate 7 functions as a cathode that injects electrons to the light emitting layer 5.

In the present invention, it is preferable to form the anode and cathode with the metals or metal oxides mentioned above in the description of the electrodes of the device.

(Hole Injection Transport Layer, Hole Transport Layer and Hole Injection Layer)

As shown in FIGS. 2 to 4, the hole injection transport layer 2, the hole transport layer 4a and the hole injection layer 4b are appropriately formed between the light emitting layer 5 and the electrode 1 (anode). As shown in FIG. 2, it is allowed to form the hole transport layer 4a further on the hole injection transport layer 2 of the present invention, and then to form the light emitting layer thereon. As shown in FIG. 3, it is allowed to form the hole injection transport layer 2 of the present invention further on the hole injection layer 4b and then to form the light emitting layer thereon. Or, as shown in FIG. 4, it is allowed to form the hole injection transport layer 2 of the present invention on the electrode 1 and then to form the light emitting layer thereon.

As shown in FIG. 2, in the case of forming the hole transport layer 4a further on the hole injection transport layer 2 of the present invention, the hole transport material used for the hole transport layer 4a is not particularly limited. It is preferable to use the hole transporting compound explained above in the description of the hole injection transport layer of the present invention. It is particularly preferable to use the same compound as the hole transporting compound used for the adjacent hole injection transport layer 2 of the present invention, from the viewpoint of increasing the adhesion stability of the interface between the hole injection transport layer and the hole transport layer, and contributing to the achievement of a longer driving lifetime.

The hole transport layer 4a can be formed with the hole transporting material and by the same method as the below-described light emitting layer. The thickness of the hole transport layer 4a is generally 0.1 to 1 µm, preferably 1 to 500 nm.

As shown in FIG. 3, in the case of forming the hole injection transport layer 2 of the present invention further on the hole injection layer 4b, the hole injection material used for the hole injection layer 4b is not particularly limited, and generally-known compounds can be used. For example, there may be mentioned phenylamines; starburst-type amines; phthalocyanines; oxides such as a vanadium oxide, a molybdenum oxide, a ruthenium oxide and an aluminum oxide; amorphous carbons; polyanilines; and polythiophene derivatives.

The hole injection layer 4b can be formed with the hole injection material by the same method as the below-described light emitting layer. The thickness of the hole injection layer 4b is generally 1 nm to 1 µm, preferably 2 to 500 nm, more preferably 5 to 200 nm.

In addition, considering hole injection properties, it is preferable to minimize the hole injection energy barrier of the interfaces as small as possible and complement the large hole injection energy barrier between the electrode 1 and the light emitting layer 5, by selecting the hole injection material and the hole transport material so as to increase the work functions of the layers step by step, from the electrode 1 side to the light emitting layer 5 (organic layer).

(Light Emitting Layer)

As shown in FIGS. 2 to 4, the light emitting layer is formed with a light emitting material and between the electrode 6 and the substrate 7 having the electrode 1 formed thereon.

The light emitting material used for the light emitting layer of the present invention, is not particularly limited, as long as it is a light emitting material generally used for organic EL devices. There may be used fluorescent materials and phosphorescent materials. In particular, there may be used materials such as dye-based light emitting materials and metal complex-based light emitting material. Also, as the light emitting material, there may be used both low-molecular compounds and high-molecular compounds.

A dopant can be added to the organic light emitting layer, in order to increase light emitting efficiency or to change light emitting wavelength. As such a dopant, there may be mentioned those generally used for organic light emitting layers.

The light emitting layer can be formed with the light emitting material by the solution application method, deposition method or transfer method. As the solution application method and deposition method, there may be mentioned those described below regarding the method for producing the device. The transfer method is, for example, a method in which a light emitting layer formed in advance on a film by the solution application method or deposition method, is attached to the hole injection transport layer 2 formed on the electrode, and then the light emitting layer 5 is transferred onto the hole injection transport layer 2 by heating. Or, the hole injection transport layer side of a laminate can be transferred on to the electrode, the laminate comprising a stack of the film, the light emitting layer 5 and the hole injection transport layer 2 in this sequence.

The thickness of the light emitting layer is generally about 1 to 500 nm, preferably about 20 to 1,000 nm. In the present invention, it is preferable to form the hole injection transport layer by the solution application method, so that there is such an advantage that process costs can be reduced when the light emitting layer is also formed by the solution application method.

<Organic Transistor>

Another embodiment of the device of the present invention is an organic transistor. Hereinafter, the layers constituting the organic transistor will be described, by way of FIGS. 5 and 6.

In the organic transistor of the present invention as shown in FIG. 5, the hole injection transport layer 2 is formed on the electrode 1 (source electrode) and the electrode 6 (drain electrode), so that there is an increase in hole injection transport ability between the organic semiconductor layer and the electrodes, and the hole injection transport layer comprising the material for hole injection transport layers according to the present invention has high film stability, thus contributing to the achievement of a longer driving lifetime.

As shown in FIG. 6, the organic transistor of the present invention can be an organic transistor such that the hole injection transport layer 2 of the present invention serves as the organic semiconductor layer 8.

Also, as shown in FIG. 5, the organic transistor of the present invention can be such that the hole injection transport layer 2 is formed on the electrodes 1 and 6, and another hole injection transport layer 2 of the present invention can be further formed as the organic semiconductor layer 8, which is made of the material that is different from the material of the hole injection transport layer formed on the electrodes.

In the case of forming the organic transistor as shown in FIG. 5, as the material for forming the organic semiconductor layer, there may be used a low- or high-molecular donor organic semiconductor material, that is, a p-type low- or high-molecular organic semiconductor material. As the organic semiconductor material, there may be used materials generally used for the organic semiconductor layer of organic transistors.

From the viewpoint of transistor properties, the carrier mobility of the organic semiconductor layer is preferably $10^{-6}$ cm/Vs or more, and particularly for the organic transistor, more preferably $10^{-3}$ cm/Vs or more.

The method for forming the organic semiconductor layer can be the same as the method for forming the organic light emitting layer of the organic EL device.

Even in the case of forming the organic transistor as shown in FIG. 5, which comprises the hole injection transport layer containing the material for hole injection transport layers according to the present invention, as the compound for constituting the organic semiconductor layer 8, it is particularly preferable to use the hole transporting compound used for the hole injection transport layer, particularly preferably the hole transporting high-molecular compound, from the viewpoint of increasing the adhesion stability of the interface between the hole injection transport layer 2 of the present invention and organic semiconductor layer 8, and contributing to the achievement of a longer driving lifetime.

The substrate, gate electrode, source electrode, drain electrode and insulating layer are not particularly limited, and those that are generally used for organic transistors can be used.

As to oxide compound solar cells, quantum-dot light emitting devices having a hole injection transport layer, other organic devices such as a dye-sensitized solar cell, organic thin layer solar cell and organic semiconductor, etc., other structures of these cells and devices are not particularly limited and can be appropriately the same as known structures, as long as the hole injection transport layer is a hole injection transport layer containing the material for hole injection transport layers according to the present invention.

(Device Production Method)

The device production method of the present invention is a method for producing a device comprising a substrate, two or more electrodes and a hole injection transport layer, the electrodes facing each other on the substrate and the hole injection transport layer being present between two of the electrodes, the method comprising a step of forming the hole injection transport layer on any one of layers on the electrodes, by using the ink for forming hole injection transport layers according to the present invention or by using an ink for forming hole injection transport layers obtained by the method for producing an ink for forming hole injection transport layers according to the present invention.

Preferably, the device production method is a method for producing a device comprising a substrate, two or more electrodes and a hole injection transport layer, the electrodes facing each other on the substrate and the hole injection transport layer being present between two of the electrodes, the method comprising steps of: obtaining a reaction product by heating a mixture of a molybdenum complex and a compound represented by the chemical formula (1); preparing a material for hole injection transport layers by removing the compound remaining unreacted from a reaction solution; preparing an ink for forming hole injection transport layers by dissolving the above-prepared material for hole injection transport layers in an aromatic hydrocarbon solvent; and forming the hole injection transport layer on any one of layers on the electrodes, by using the above-prepared ink for forming hole injection transport layers.

According to the device production method of the present invention, by using the ink for forming hole injection transport layers according to the present invention, it is possible to produce the hole injection transport layer can be formed by the solution application method and, as described above, to obtain a long-life device.

<Step of Forming the Hole Injection Transport Layer>

In the present invention, the step of forming the hole injection transport layer is not particularly limited. However, it is preferable to use the hole injection transport layer by using the ink for forming hole injection transport layers according to the present invention and by the solution application method. By using the solution application method, the device with the following characteristics can be formed: no deposition apparatus is needed when forming the hole injection transport layer; selective coating can be applied without the use of mask deposition, etc.; the productivity is high; and the adhesion stability of the interface between the electrode and the hole injection transport layer and between the hole injection transport layer and the organic layer, is high.

As used herein, "solution application method" is a method for forming the hole injection transport layer by applying the ink for forming hole injection transport layers onto a base (electrode or layer) and drying the applied ink. Because the aromatic hydrocarbon solvent is used in the ink for forming hole injection transport layers according to the present invention, removal of the solvent is easy and even if the solvent remains, it is less likely to have adverse effects on the device. Therefore, it is presumed that there is a reduction in the effects of the remaining solvent, which serves as impurity, and a long-life device can be obtained.

Examples of the solution application method include a dipping method, spray coating method, spin coating method, blade coating method, dip coating method, casting method, roller coating method, bar coating method, die coating method and liquid dropping methods such as an ink jet method. To form a monolayer, a dipping method or dip coating method is preferably used.

In the device production method of the present invention, conventionally-known steps can be appropriately used, as needed.

EXAMPLES

Hereinafter, the present invention will be explained in more detail by way of examples, in which all designations of "part" or "parts" are part or parts by mass, unless otherwise noted. The scope of the present invention is not restricted by these examples.

Example 1

(1) Production of Material 1 for Hole Injection Transport Layers

First, 0.33 g of molybdenum hexacarbonyl (manufactured by Kanto Chemical Co., Inc.) and 2.3 g of dipivaloylmethane (manufactured by Tokyo Chemical Industry Co., Ltd.) were put in a three-necked flask. Under an argon gas atmosphere, while stirring at 130° C., the mixture was heated to reflux for 3 hours, thus obtaining a dark red reaction solution. The reaction solution obtained was put in a glass tube oven. The oven was depressurized by a vacuum pump, and the reaction solution was heated at 80° C. for 3 hours, so that unreacted dipivaloylmethane was removed from the reaction solution, thus obtaining a black solid reaction product 1 (the material 1 for hole injection transport layers) of 0.045 g.

<Analysis of Reaction Product>

The reaction product 1 obtained in Example 1 was analyzed by the ATR method, using an FT-IR (FT-IR610 manufactured by JASCO Corporation).

Figure 7:
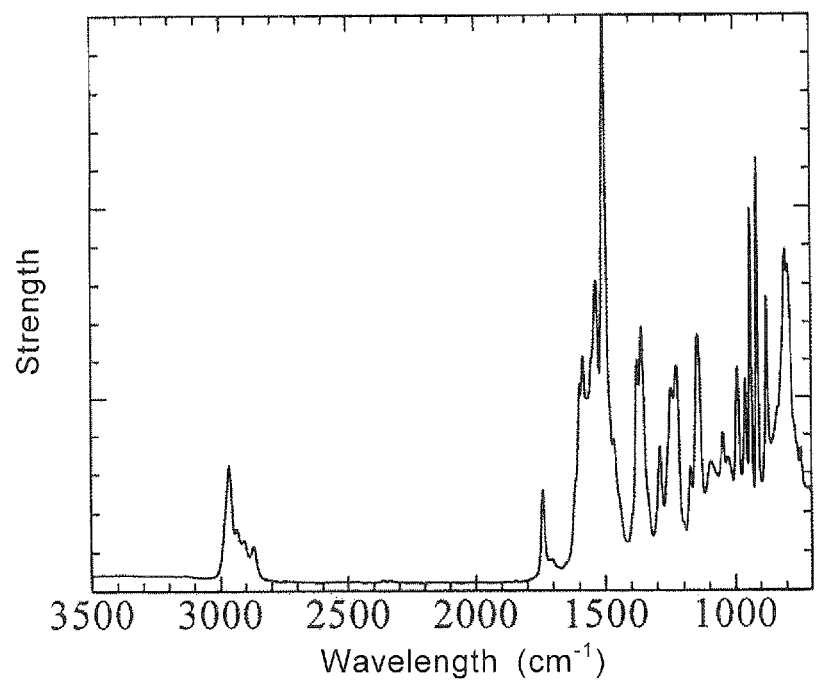
FIG. 7 shows the IR spectrum of the reaction product 1 obtained in Example 1.

FIG. 7 shows the IR of the reaction product 1 obtained in Example 1. From the IR spectrum of the reaction product 1, peaks assigned to t-butyl group were observed at 3,000 cm$^{-1}$ and 1,200 cm$^{-1}$ were observed. Also, peaks assigned to Mo=O were observed at 1,535 cm$^{-1}$ and near 950 cm$^{-1}$. From these facts, it is clear that a structure derived from dipivaloylmethane and a molybdenum oxide were contained in the reaction product 1 and thus the reaction product 1 is an organic-inorganic composite oxide.

<Solubility Test on Reaction Product>

First, 0.001 g of the reaction product 1 obtained in Example 1 was added to 1.0 g of toluene. The mixture was stirred for 1 hour at room temperature and then allowed to stand for 30 minutes.

The following result was obtained from the solubility test. The reaction product 1 obtained in Example 1 was dissolved in the toluene immediately after it was added to the toluene. A bluish black solution was thus obtained, and the solution formed no precipitation even after it was stirred and allowed to stand.

[Evaluation Criteria of Solubility Test]

◉ : The reaction product was dissolved immediately after preparation of the solution.

○: The reaction product was dissolved after preparation and heating of the solution for 1 hour.

Δ: A small amount of precipitate was observed after preparation and heating of the solution. The solution was colored.

x: The reaction product was not dissolved after preparation and heating of the solution. The solution was not colored and was a suspension.

(2) Preparation of Ink 1 for Forming Hole Injection Transport Layers

The material 1 for hole injection transport layers, which was obtained in Example 1, and poly[(9,9-dioctylfluorenyl-2,7-diyl)-co-(4,4'-(N-4-sec-butylphenyl))diphenylamine)] (TFB), which is a conjugated high-molecular material, were mixed at a mass ratio of 2:1 and dissolved at a concentration of 0.4 wt % in xylene, thus obtaining the ink 1 for forming hole injection transport layers.

(3) Production of Device

On a glass substrate equipped with a transparent anode, a hole injection transport layer, a light emitting layer, a hole block layer, an electron transport layer, an electron injection layer and a cathode, were formed in this sequence, according to the below-described process, and then finally encapsulated to produce an organic EL device. All of the above except the transparent anode were processed inside a nitrogen-substituted glove box having a water concentration of 0.1 ppm or less and an oxygen concentration of 0.1 ppm or less.

First, a glass substrate equipped with a thin indium tin oxide (ITO) film having a thickness of 150 nm (manufactured by Sanyo Vacuum Industries Co., Ltd.) was used as the anode. The ITO film of the glass substrate was patterned in a strip shape. The thus-obtained substrate was subjected to ultrasonic cleaning with a neutral detergent and then with ultrapure water, and a UV-ozone treatment.

Next, the above-obtained ink 1 for forming hole injection transport layers, was applied onto the washed anode by the spin coating method. The coated substrate was heated with a hot plate at 200° C. for 30 minutes to remove the solvent, thereby forming the hole injection transport layer containing the material 1 for hole injection transport layers. When dried, the hole injection transport layer had a thickness of 20 nm.

On the hole injection transport layer, as the light emitting layer, a mixed thin film was formed by deposition, the film containing tris(2-phenylpyridine)iridium(III)(Ir(ppy)$_3$) as the light-emitting dopant and 4,4'-bis(2,2-carbazole-9-yl)biphenyl (CBP) as the host. The mixed thin film was co-deposited as follows: in a vacuum at a pressure of $1\times10^{-4}$ Pa, the film was formed by the resistance heating method so that the volume ratio of the host and dopant is 20:1 and the total film thickness is 30 nm.

On the light emitting layer, as the hole block layer, a bis(2-methyl-8-quinolinolato)(p-phenylphenolate)aluminum (BAlq) complex thin film was formed by deposition. The BAlq thin film was formed in a vacuum at a pressure of $1\times10^{-4}$ Pa and by the resistance heating method so as to have a thickness of 10 nm.

On the hole block layer, as the electron transport layer, a tris(8-quinolinolato)aluminum (Alq$_3$) complex thin film was formed by deposition. The Alq$_3$ thin film was formed in a vacuum at a pressure of $1\times10^{-4}$ Pa, by the resistance heating evaporation method.

On the electron transport layer, the following were formed in sequence by the resistance heating evaporation method, in a vacuum at a pressure of $1\times10^{-4}$ Pa: as the electron injection layer, lithium fluoride (LiF) was formed into a layer having a thickness of 0.5 nm, and as the cathode, Al was formed into a layer having a thickness of 100 nm.

After forming the cathode, the stack of the electrodes and layers was encapsulated inside the glove box, using non-alkali glass and a UV-curable epoxy adhesive, thus obtaining the organic EL device of Example 1.

Examples 2 to 6

(1) Production of Materials 2 to 6 for Hole Injection Transport Layers

The reaction product 2 (the material 2 for hole injection transport layers) to the reaction product 6 (the material 2 for hole injection transport layers) were obtained in the same manner as Example 1, except that the compounds represented by the chemical formula (1), which are shown in Table 1, were used in place of dipivaloylmethane.

Evaluation of the solubility of the thus-obtained reaction products 2 (the material 2 for hole injection transport layers) to reaction product 6 (the material 6 for hole injection transport layers) was conducted in the same manner as Example 1. The results are shown in Table 1.

(2) Preparation of Inks 2 to 6 for Forming Hole Injection Transport Layers

The inks 2 to 6 for forming hole injection transport layers were obtained in the same manner as Example 1, except that the above-obtained materials 2 to 6 for hole injection transport layers were used in place of the material 1 for hole injection transport layers.

(3) Production of Devices

The organic EL devices of Examples 2 to 6 were obtained in the same manner as Example 1, except that the inks 2 to 6 for forming hole injection transport layers were used in place of the ink 1 for forming hole injection transport layers.

TABLE 1

| | Compound represented by the chemical formula (1) | | | | Evaluation of solubility |
|---|---|---|---|---|---|
| | $R^1$ | $X^1$ | $X^2$ | $R^2$ | |
| Example 1 | t-Butyl | Direct bond | Direct bond | t-Butyl | ○ |
| Example 2 | Isopropyl | Direct bond | Direct bond | Isopropyl | Δ |
| Example 3 | Phenyl | Direct bond | Direct bond | Phenyl | ○ |
| Example 4 | Methyl | Direct bond | Direct bond | 1,3,5-Trimethylphenyl | ○ |
| Example 5 | Methoxyphenyl | Direct bond | Direct bond | Methoxyphenyl | ◎ |
| Example 6 | Methyl | Direct bond | Direct bond | t-Butyl | ○ |
| Comparative Example 1 | Methyl | Direct bond | Direct bond | Methyl | X |

Comparative Example 1

(1) Production of Comparative Material 1 for Hole Injection Transport Layers

First, 0.055 g of a comparative reaction product 1 (the comparative material 1 for hole injection transport layers) was obtained in the same manner as Example 1, which was in a yellow solid form, except that 1.25 g of acetylacetone (manufactured by Tokyo Chemical Industry Co., Ltd.) was used in place of dipivaloylmethane.

Evaluation of the solubility of the thus-obtained comparative reaction product 1 (the comparative material 1 for hole injection transport layers) was conducted in the same manner as Example 1. The results are shown in Table 1.

(2) Preparation of Comparative Ink 1 for Forming Hole Injection Transport Layers The comparative ink 1 for forming hole injection transport layers was obtained in the same manner as Example 1, except that the above-obtained comparative material 1 for hole injection transport layers was used in place of the material 1 for hole injection transport layers.

(3) Production of Device

The organic EL device of Comparative Example 1 was obtained in the same manner as Example 1, except that the comparative ink 1 for forming hole injection transport layers was used in place of the ink 1 for forming hole injection transport layers.

Comparative Example 2

(1) Preparation of Comparative Ink 2 for Forming Hole Injection Transport Layers The comparative ink 2 for forming hole injection transport layers was obtained in the same manner as Example 1, except that MoO$_2$(acac)$_2$ (manufactured by Tokyo Chemical Industry Co., Ltd.) was used in place of the material 1 for hole injection transport layers. MoO$_2$(acac)$_2$ had low solubility in xylene. MoO$_2$(acac)$_2$ was in the form of precipitation.

(2) Production of Device

The organic EL device of Comparative Example 2 was obtained in the same manner as Example 1, except that the comparative ink 2 for forming hole injection transport layers was used in place of the ink 1 for forming hole injection transport layers.

Comparative Example 3

(1) Preparation of Comparative Ink 3 for Forming Hole Injection Transport Layers The comparative ink 3 for forming hole injection transport layers was obtained in the same manner as Comparative Example 2, except that ethyl benzoate was used in place of xylene. Since a small amount of MoO$_2$(acac)$_2$ was soluble in ethyl benzoate, the ink thus obtained was an ink in which MoO$_2$(acac)$_2$ was dissolved.

(2) Production of Device

The organic EL device of Comparative Example 3 was obtained in the same manner as Example 1, except that comparative ink 3 for forming hole injection transport layers was used in place of the ink 1 for forming hole injection transport layers.

<Evaluation of Device Properties>

The organic EL devices produced in the above Examples and Comparative Examples emitted green light that is derived from Ir(ppy)$_3$. The emission luminance and spectrum of these organic EL devices were measured by driving spectroradiometer SR-2 (manufactured by Topcon Corporation) at 10 mA/cm$^2$. The measurement results are shown in Table 2. Current efficiency was calculated from driving current and luminance.

The lifetime property of the organic EL devices was evaluated by observing the state in which luminance is decreased over time by constant current driving. Herein, Examples and Comparative Examples were compared, considering the current efficiency and life to half-luminance of Example 1 as 1 each.

TABLE 2

| | Ink for forming hole injection transport layers | | | |
|---|---|---|---|---|
| | Material for hole injection transport layers | Solvent | Current efficiency | Life to half-luminance |
| Example 1 | Reaction product 1 | Xylene | 1.00 | 1.00 |
| Example 2 | Reaction product 2 | Xylene | 0.89 | 0.85 |
| Example 3 | Reaction product 3 | Xylene | 1.02 | 0.98 |
| Example 4 | Reaction product 4 | Xylene | 1.02 | 1.10 |
| Example 5 | Reaction product 5 | Xylene | 1.00 | 1.15 |
| Example 6 | Reaction product 6 | Xylene | 1.05 | 0.99 |
| Comparative Example 1 | Comparative reaction product 1 | Xylene | — (*1) | — (*1) |
| Comparative Example 2 | MoO$_2$(acac)$_2$ | Xylene | — (*1) | — (*1) |
| Comparative Example 3 | MoO$_2$(acac)$_2$ | Ethyl benzoate | 0.73 | 0.61 |

In Table 2, "*1" means "unmeasurable due to short circuit".

<Results>

From a comparison between Examples 1 to 6 and Comparative Example 3, it is clear that there is an increase in lifetime when the No reaction products 1 to 6, which are soluble in xylene, are used in the hole injection transport layer.

In Comparative Examples 1 and 2, the Mo reaction product and MoO$_2$(acac)$_2$ used had poor solubility in xylene and, as a result, had poor film forming properties. In Comparative Examples 1 and 2, therefore, the material aggregated served as a luminescent spot and caused short circuits. Therefore, it is clear that the devices of Comparative Examples 1 and 2 have poor stability.

REFERENCE SIGNS LIST

1. Electrode
2. Hole injection transport layer
3. Organic layer
4a. Hole transport layer
4b. Hole injection layer
5. Light emitting layer
6. Electrode
7. Substrate
8. Organic semiconductor layer
9. Electrode
10. Insulating layer

The invention claimed is:

1. A material for hole injection transport layers, which is a reaction product of a molybdenum complex with a compound represented by the following chemical formula (1):

Chemical Formula (1)

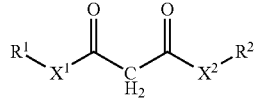

wherein R$^1$ and R$^2$ each independently represent a hydrocarbon group which can have a substituent or contain a heteroatom, in which the hydrocarbon group is a straight-chain, branched-chain or cyclic, saturated or unsaturated aliphatic hydrocarbon group, a monocyclic or polycyclic aromatic croup, or combinations thereof; X$^1$ and X$^2$ each independently represent a direct bond; and a total of carbon numbers of R$^1$ and R$^2$ is 5 or more and wherein 0.1% by mass or more of the material is dissolved in at least one kind of aromatic hydrocarbon solvent selected from the group consisting of toluene, xylene, anisole and mesitylene, at 25° C.

2. The material for hole injection transport layers according to claim 1, wherein at least one of R$^1$ and R$^2$ has a carbon number of 4 or more.

3. The material for hole injection transport layers according to claim 1, wherein the compound represented by the chemical formula (1) is a solvent for the molybdenum complex.

4. The material for hole injection transport layers according to claim 1, wherein the reaction product is a molybdenum oxide.

5. A method for producing a material for hole injection transport layers, comprising steps of: obtaining a reaction product by heating a mixture of a molybdenum complex and a compound represented by the following chemical formula (1); and removing the compound remaining unreacted from a reaction solution:

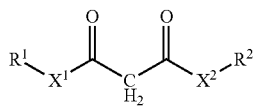

Chemical Formula (1)

wherein $R^1$ and $R^2$ each independently represent a hydrocarbon group which can have a substituent or contain a heteroatom $X^1$ and $X^2$ each independently represents a direct bond; and a total of carbon numbers of $R^1$ and $R^2$ is 5 or more.

6. The method for producing a material for hole injection transport layers according to claim 5, wherein at least one of $R^1$ and $R^2$ has a carbon number of 4 or more.

7. The method for producing a material for hole injection transport layers according to claim 5, wherein the compound represented by the chemical formula (1) is a solvent for the molybdenum complex, and an organic solvent contained in the mixture and different from the compound represented by the chemical formula (1) accounts for only 10.0% mass or less of the mixture.

8. The method for producing a material for hole injection transport layers according to claim 5, wherein the reaction product is a molybdenum oxide.

9. An ink for forming hole injection transport layers, comprising the material for hole injection transport layers defined by claim 1 and an aromatic hydrocarbon solvent.

10. The ink for forming hole injection transport layers according to claim 9, containing substantially no compound represented by the chemical formula (1).

11. The ink for forming hole injection transport layers according to claim 9, further comprising a hole transporting compound.

12. A method for producing an ink for forming hole injection transport layers, comprising a step of dissolving a material for hole injection transport layers which is a reaction product of a molybdenum complex with a compound represented by the following chemical formula (1):

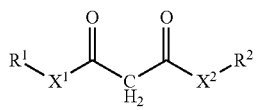

Chemical Formula (1)

wherein $R^1$ and $R^2$ each independently represent a hydrocarbon group which can have a substituent or contain a heteroatom $X^1$ and $X^2$ each independently represents a direct bond; and a total of carbon numbers of $R^1$ and $R^2$ is 5 or more, in an aromatic hydrocarbon solvent, or dissolving in an aromatic hydrocarbon solvent the material for hole injection transport layers obtained by the method comprising the steps of: obtaining a reaction product by heating a mixture of the molybdenum complex and the compound represented by chemical formula (1); and removing the compound remaining unreacted from a reaction solution.

13. A device comprising a substrate, two or more electrodes and a hole injection transport layer, the electrodes facing each other on the substrate and the hole injection transport layer being present between two of the electrodes, wherein the hole injection transport layer comprises the material for hole injection transport layers defined by claim 1.

14. The device according to claim 13, wherein the hole injection transport layer further comprises a hole transporting compound.

15. A method for producing a device comprising a substrate, two or more electrodes and a hole injection transport layer, the electrodes facing each other on the substrate and the hole injection transport layer being present between two of the electrodes, the method comprising a step of forming the hole injection transport layer on any one of layers on the electrodes, by using the ink for forming hole injection transport layers defined by claim 9 or by using an ink for forming hole injection transport layers obtained by a method for producing an ink for forming hole injection transport layers, comprising a step of dissolving a material for hole injection transport layers which is a reaction product of a molybdenum complex with a compound represented by the following chemical formula (1):

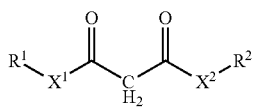

Chemical Formula (1)

wherein $R^1$ and $R^2$ each independently represent a hydrocarbon group which can have a substituent or contain a heteroatom $X^1$ and $X^2$ each independently represents a direct bond; and a total of carbon numbers of $R^1$ and $R^2$ is 5 or more, in an aromatic hydrocarbon solvent, or dissolving in an aromatic hydrocarbon solvent the material for hole injection transport layers obtained by the method comprising the steps of: obtaining a reaction product by heating a mixture of the molybdenum complex and the compound represented by chemical formula (1); and removing the compound remaining unreacted from a reaction solution.

* * * * *